United States Patent [19]

Pribyl et al.

[11] Patent Number: 5,222,043
[45] Date of Patent: Jun. 22, 1993

[54] CIRCUIT CONFIGURATION FOR IDENTIFICATION OF INTEGRATED SEMICONDUCTOR CIRCUITRIES

[75] Inventors: Wolfgang Pribyl, Graz, Austria; Raymond Sittig, Deerfield, Ill.

[73] Assignee: Siemens Aktiengesellschaft, Munich, Fed. Rep. of Germany

[21] Appl. No.: 945,598

[22] Filed: Sep. 16, 1992

Related U.S. Application Data

[63] Continuation of Ser. No. 546,251, Jun. 29, 1990, abandoned.

[30] Foreign Application Priority Data

Jun. 29, 1989 [EP] European Pat. Off. ........ 89111871.3

[51] Int. Cl.$^5$ ............................................. G11C 11/40
[52] U.S. Cl. .................. 365/189.01; 365/96; 365/225.7; 365/189.12
[58] Field of Search .................... 365/189.12, 200, 240, 365/78, 219, 225.7, 189.01, 96; 377/73, 74, 110

[56] References Cited

U.S. PATENT DOCUMENTS 4,633,441 12/1986 Ishimoto .................. 365/240 X Primary Examiner—Joseph A. Popek
Attorney, Agent, or Firm—Herbert L. Lerner; Laurence A. Greenberg

[57] ABSTRACT

A circuit configuration for the identification of integrated semiconductor circuitries includes n programmable elements each having an output. A parallel-serial shift register has n parallel inputs each being connected to a respective one of the outputs of the n programmable elements, a data output, a control input for transferring electrical states of the programmable elements into the parallel-serial shift register, and a clock input for controlling a shift function of the parallel-serial shift register as a function of a clock signal to be applied to the clock input.

11 Claims, 2 Drawing Sheets

CIRCUIT CONFIGURATION FOR IDENTIFICATION OF INTEGRATED SEMICONDUCTOR CIRCUITRIES

This application is a continuation of application Ser. No. 546,251, filed Jun. 29, 1990, now abandoned.

The invention relates to a circuit configuration for the identification of integrated semiconductor circuitries.

Configurations for identifying integrated semiconductor circuitries are already known from Published European Application Nos. 0 066 835 A2, 0 066 836 A2 and 0 133 955 A1. They are used to enable "jotting down" specialized circuitry properties such as speed classification and possible operating modes of the circuitry on the semiconductor chip itself (such as page mode and nibble mode in integrated semiconductor memories).

However, the proposed prior art devices have two substantial disadvantages: First, only a very narrowly limited number of identification characteristics can be incorporated into the circuitries. Second, some of these characteristics (as in Published European Application No. 0 066 835 A2) can only be evaluated on what is known as the wafer plane.

It is accordingly an object of the invention to provide a circuit configuration for the identification of integrated semiconductor circuitries, which overcomes the hereinafore-mentioned disadvantages of the heretofore-known devices of this general type, which requires minimum space and yet can contain the largest possible number of identification characteristics (such as batch number), and which permits the identification characteristics thereof to be read out even after the circuitries have been encapsulated into a housing.

With the foregoing and other objects in view there is provided, in accordance with the invention, a circuit configuration for the identification of integrated semiconductor circuitries, comprising n programmable elements each having an output; and a parallel-serial shift register having n parallel inputs each being connected to a respective one of the outputs of the n programmable elements, a data output, a control input for transferring electrical states of the programmable elements into the parallel-serial shift register, and a clock input for controlling a shift function of the parallel-serial shift register as a function of a clock signal to be applied to the clock input.

In accordance with another feature of the invention, the programmable elements are mechanically, thermally or chemically disconnectable means.

In accordance with a further feature of the invention, the programmable elements are disconnectable means in the form of resistors.

In accordance with an added feature of the invention, the resistors are transistors connected as resistors.

In accordance with an additional feature of the invention, the programmable elements are laser fuses.

In accordance with yet another feature of the invention, the programmable elements are disconnectable conductor tracks.

In accordance with yet a further feature of the invention, there are provided load elements each being coupled to the output of a respective one of the programmable elements.

In accordance with a concomitant feature of the invention, the parallel-serial shift register has a serial input being switched to be electrically inactive.

Other features which are considered as characteristic for the invention are set forth in the appended claims.

Although the invention is illustrated and described herein as embodied in a circuit configuration for the identification of integrated semiconductor circuitries, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIGS. 5, 6 and 7 show alternative embodiments of the circuit of FIG. 2, respectively with mechanically, thermally and chemically disconnectable switching elements;

FIG. 8 shows the block circuit of FIG. 2 with disconnectable conductor tracks; and FIG. 9 is a timing diagram for a circuit according to FIG. 4.

Figure 1:
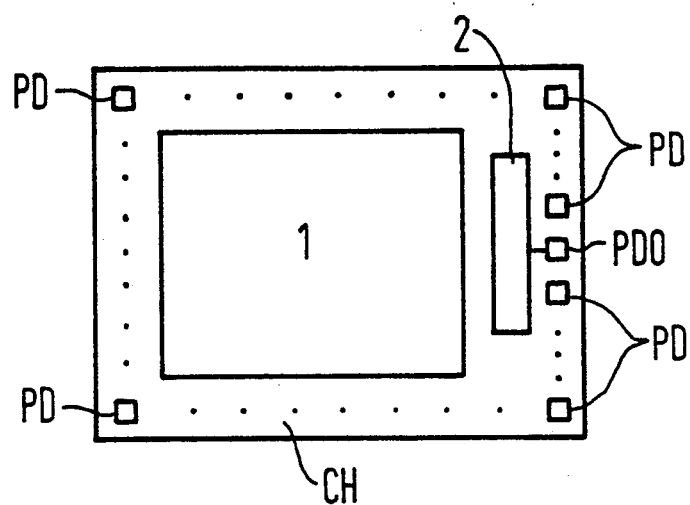
FIG. 1 is a diagrammatic plan view of a circuit configuration according to the invention in an integrated semiconductor circuitry.
Figure 2:
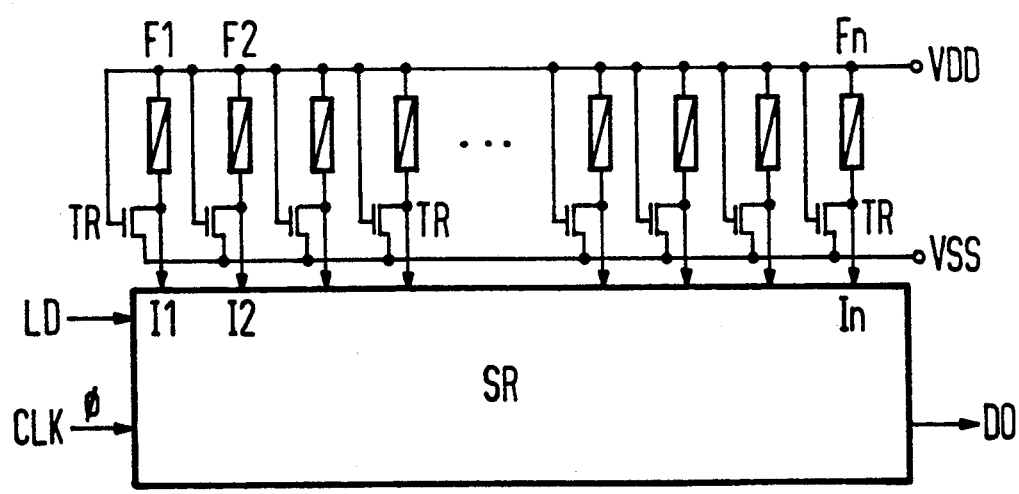
FIGS. 2 and 3 are schematic and block circuit diagrams showing various exemplary embodiments of the invention.

Referring now to the figures of the drawing in detail and first, particularly, to FIG. 1 thereof, there is seen a highly diagrammatic plan view showing a semiconductor chip CH of an integrated semiconductor circuitry, having a semiconductor circuit 1 specifically integrated for the semiconductor circuitry, and connection pads PD thereof. Additionally shown on the chip CH is a circuit configuration 2 according to the invention. The size ratio between the circuit configuration 2 and the integrated semiconductor circuit 1 is essentially overly largely dimensioned as compared with the actual conditions that are technically necessary. However, this is done for the sake of easier comprehension of the illustration. Referring to FIGS. 1 and 2, it is seen that a data output DO of the circuit configuration 2 is guided along a connection pad PDO that is especially assigned to it on the semiconductor chip CH, so that the data output DO is accessible from outside the component through connection pins. However, if a suitable multiplexer is used, an existing connection pad PD on the chip CH can be used as a connection pad PDO for the data output DO.

Figure 4:
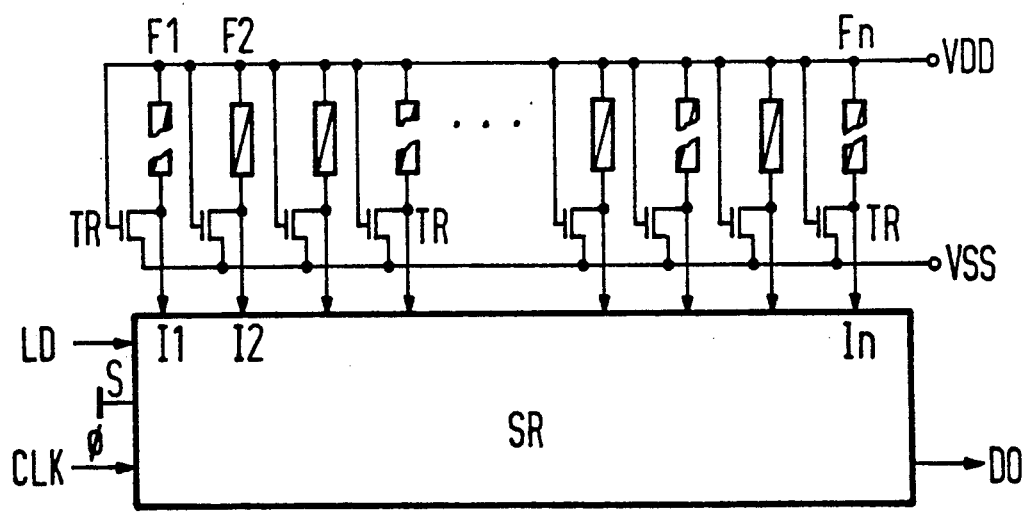
FIG. 4 is a schematic and block circuit diagram showing the embodiment of FIG. 2 in encoded state.

The embodiment of FIG. 2 shows the circuit configuration 2 according to the invention in greater detail. The circuit configuration 2 contains n (n = a natural number) programmable elements F1 . . . Fn in an n-stage parallel-serial shift register SR. Each output of the programmable elements F1 . . . Fn forms one parallel input I1 . . . In of the parallel-serial shift register SR. FIG. 2 also shows the data output DO of the parallel-serial shift register SR, as mentioned above. The parallel-serial shift register SR furthermore includes a control input LD. Activation of the control input LD causes a chronologically parallel takeover of the electrical states of the programmable elements F1 . . . Fn into the various register stages of the parallel-serial shift register SR as its contents. The parallel-serial shift register SR also includes a clock input CLK. The contents of the parallel-serial shift register SR can be shifted bit by bit to its data output DO with the aid of a clock signal $\phi$ that can be applied to the clock input CLK. In a further feature of the invention, as shown in FIGS. 2 and 4, one load element TR is coupled to the output side of each programmable element F1 . . . Fn.

Figure 3:
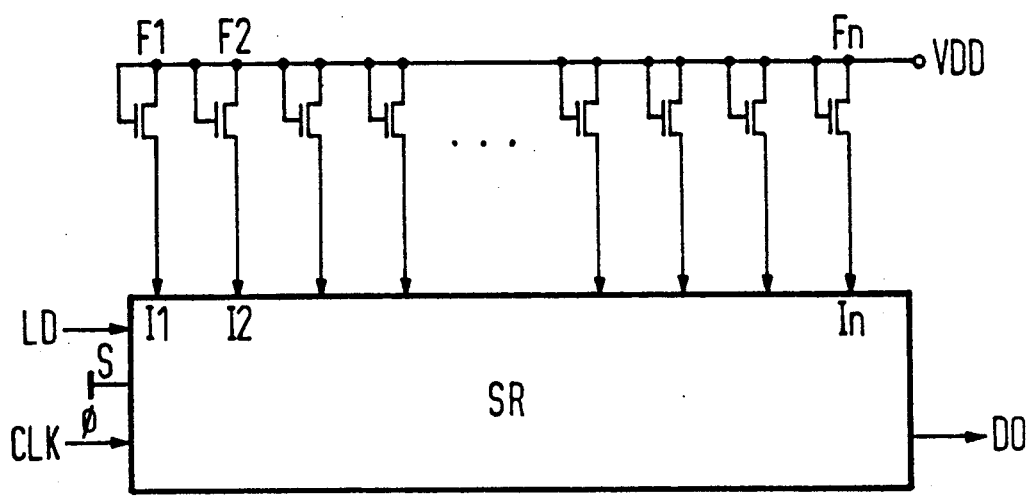

The input sides of the programmable elements F1 . . . Fn are connected to a first fixed electrical potential, at least during the identification process. Typically, this may be a supply potential VDD of the integrated semiconductor circuit 1. The programmable elements F1 . . . Fn are means, especially resistors, that can be disconnected mechanically, thermally or chemically depending on the embodiment being used. In the embodiment of FIG. 3, the programmable elements F1 . . . Fn are transistors that are connected as resistors. A further embodiment is represented by the use of disconnectable conductor tracks. In the embodiment shown in FIGS. 2 and 4, the programmable elements F1 . . . Fn are so-called laser fuses, such as are used in integrated semiconductor memories for redundancy address decoders. The aids which are already typical for programming redundancy address decoders can be used in this case for programming the programmable elements F1 . . . Fn. The programmable elements F1 . . . Fn are programmed by disconnection. In a non-programmed programmable element (such as the programmable element F2 in FIG. 4), the aforementioned fixed electrical potential (for instance the first supply potential VDD) thus substantially reaches the associated parallel input (input I2 in FIG. 4) of the parallel-serial shift register SR.

In contrast, in a programmed programmable element, the criterion is whether or not a load element TR is provided. If not, which is the situation shown in FIG. 3, the parallel inputs I1 . . . In of the parallel-serial shift register SR should be laid out in such a way that when non-wired (which is equivalent to programming the associated programmable element), they are connected internally in the shift register to a further electrical potential, which is unequal to the aforementioned fixed electrical potential. In the case of a programmed programmable element, the associated parallel input is accordingly applied to the further electrical potential.

In the case in which load elements TR are provided and connected with as high impedance as possible to a second fixed electrical potential, that typically is the other supply potential VSS of the integrated semiconductor circuit 1, the parallel input (corresponding to the parallel input I1 of FIG. 4) associated with a programmed programmable element (such as the programmable element F1 in FIG. 4) is connected to the second fixed electrical potential specified by the load element TR.

Accordingly, the following possible states of the parallel inputs I1 . . . In exist.

1) The programmable element is not programmed: The associated parallel input is applied to the first fixed electrical potential.

2) The programmable element is programmed: The associated parallel input is applied either to the further electrical potential (which preferably is equal in value to the second fixed electrical potential; this is the embodiment without load elements TR), or to the second fixed electrical potential (for the embodiment with load elements TR).

When n programmable elements F1 . . . Fn and one n-bit-wide parallel-serial shift register SR are used, the invention enables programming of a normal state (in which all n programmable elements F1 . . . Fn are not programmed), and $2^n - 1$ different code values. This high number of code values is not able to be provided in the known prior art, given the small surfaces typically available in the field of integrated semiconductor circuits.

The programmed code or the (non-programmed) normal state can be read out as follows: First, while being controlled through the control input LD, the information (that is, the first or second fixed electrical potential) that is applied to the parallel inputs I1 . . . In, and which information is equivalent to the state of the programmable elements F1 .. Fn, is taken over in parallel into the stages of the parallel-serial shift register SR. By applying the clock signal $\phi$ to the clock input CLK, this information can be read out through the data output DO of the parallel-serial shift register SR. Thus this information can be picked up, for example at the pad PDO of the semiconductor circuitry, and it is also available externally of the semiconductor circuitry through a component connection connected thereto. However, the data output DO can also be connected to the semiconductor circuit 1. Accordingly, the integrated semiconductor circuitry and its technical properties can, for instance, be identified accordingly.

If a shift register of the kind typically furnished in so-called cell libraries, or parts thereof, is used for the parallel shift register SR, then an additional serial input S of the shift register that might be available can advantageously be switched to be electrically inactive, for instance by being hardwired to the other supply potential VSS of the integrated semiconductor circuit 1.

We claim:

1. An integrated semiconductor, comprising integrated semiconductor circuityr, and a circuit configuration of the identification of said integrated semiconductor circuitry, said circuit configuration being electrically insulated from said semiconductor circuitry and including n programmable elements each having an output; and a parallel-serial shift register having:
  n parallel inputs each being connected to a respective one of the outputs of said n programmable elements,
  a data output,
  a control input for transferring electrical states of said programmable elements into said parallel-serial shift register, and
  a clock input for controlling a shift function of said parallel-serial shift register as a function of a clock signal to be applied to the clock input.

2. The integrated semiconductor according to claim 1, wherein said programmable elements are mechanically disconnectable means.

3. The integrated semiconductor according to claim 1, wherein said programmable elements are thermally disconnectable means.

4. The integrated semiconductor according to claim 1, wherein said programmable elements are chemically disconnectable means.

5. The integrated semiconductor according to claim 1, wherein said programmable elements are disconnectable means in the form of resistors.

6. The integrated semiconductor according to claim 5, wherein said resistors are transistors connected as resistors.

7. The integrated semiconductor according to claim 1, wherein said programmable elements are laser fuses.

8. The integrated semiconductor according to claim 1, wherein said programmable elements are disconnectable conductor tracks.

9. The integrated semiconductor according to claim 1, including load elements each being coupled to the output of a respective one of said programmable elements.

10. The integrated semiconductor according to claim 1, wherein said parallel-serial shift register has a serial data input being switched to be electrically inactive.

11. A semiconductor circuit configuration, comprising integrated semiconductor circuitry, and an identification circuit for the identification of said integrated semiconductor circuitry, said identification circuit being electrically insulated from said integrated semiconductor circuitry and including n programmable elements each having an output; and a parallel-serial shift register having n parallel inputs each being connected to a respective one of the outputs of said n programmable elements.

* * * * *